(12) United States Patent
Nakano

(10) Patent No.: US 6,344,609 B1
(45) Date of Patent: Feb. 5, 2002

(54) ELECTRONIC UNIT EFFECTIVELY UTILIZING CIRCUIT BOARD SURFACE

(75) Inventor: Kazuhiro Nakano, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/586,659

(22) Filed: Jun. 1, 2000

(30) Foreign Application Priority Data

Jun. 3, 1999 (JP) ............................................. 11-156438
Jan. 24, 2000 (JP) ............................................. 12-017950

(51) Int. Cl.⁷ .............................. H05K 9/00; H05K 5/00
(52) U.S. Cl. ...................... 174/35 GC; 174/51; 361/753
(58) Field of Search ......................... 174/35 GC, 35 R, 174/35 MS, 255, 261, 262, 263, 264, 265, 266, 51; 361/753, 816, 818, 799, 800; 257/678, 690, 692, 693, 728

(56) References Cited

U.S. PATENT DOCUMENTS

| 4,551,747 A | * | 11/1985 | Gilbert et al. ................. 357/74 |
| 4,614,194 A | * | 9/1986 | Jones et al. ............... 128/419 P |
| 5,051,869 A | * | 9/1991 | Goldfarb ..................... 361/399 |
| 5,455,385 A | | 10/1995 | Newton et al. |
| 5,637,916 A | * | 6/1997 | Joshi ........................... 257/668 |
| 5,639,989 A | * | 6/1997 | Higgins, III ............ 174/35 MS |
| 5,825,084 A | | 10/1998 | Lau et al. |
| 5,864,092 A | | 1/1999 | Gore et al. |
| 5,939,817 A | * | 8/1999 | Takado ........................ 310/348 |
| 6,057,600 A | * | 5/2000 | Kitazawa et al. ............ 257/728 |

FOREIGN PATENT DOCUMENTS

| JP | 10163647 | * | 6/1998 |
| JP | 11-340346 | | 12/1999 |

* cited by examiner

Primary Examiner—Dean A. Reichard
Assistant Examiner—Carmelo Oliva
(74) Attorney, Agent, or Firm—Brinks Hofer Gilson & Lione

(57) ABSTRACT

An electronic unit is provided that effectively utilizes the upper surface of a circuit board as a wiring pattern and reduces the size of the electronic unit. Wiring patterns and grounding patterns are provided on the upper surface of a circuit board. The wiring patterns and grounding patterns are connected to wiring terminal electrode portions and grounding terminal electrode portions by connection conductors, respectively, provided in through-holes. This allows a cover, covering electronic parts on the circuit board, to be effectively mounted as the entire outer periphery of the first surface of the circuit board is covered.

10 Claims, 5 Drawing Sheets

ELECTRONIC UNIT EFFECTIVELY UTILIZING CIRCUIT BOARD SURFACE

BACKGROUND OF THE INVENTION

1. Field of the Invention

The present invention relates to an electronic unit such as a voltage-controlled oscillator for use in a mobile phone.

2. Description of the Related Art

A conventional electronic unit such as a voltage-controlled oscillator will be described with reference to FIGS. 9 through 12. FIG. 9 is a plan view, FIG. 10 is a front view, FIG. 11 is a side view, and 12 is a bottom view. A rectangular circuit board 21 is formed by stacking together a plurality of substrates. As indicated by the shaded portions in FIG. 9, wiring patterns 22 and grounding patterns 23 are formed on an upper surface 21a of the circuit board. Although not shown, the wiring patterns 22 and the grounding patterns 23 are also formed between the layers of the board.

A plurality of side through portions 21c consisting of arcuate recesses are formed on the four side surfaces 21b of the circuit board 21. The side through portions 21c are equipped with side electrode portions 24 connected to the wiring patterns 22 and side electrode portions 25 connected to the grounding patterns 23.

A plurality of wiring terminal electrode portions 26 and grounding terminal electrode portions 27 are provided at predetermined intervals on the lower side 21d of the circuit board 21. The wiring terminal electrode portions 26 are connected to the side electrode portions 24, which are connected to the wiring patterns 22, and the grounding terminal electrode portions 27 are connected to the side electrode portions 25, which are connected to the grounding patterns 23.

A box-shaped cover 28 formed of a metal plate has a top wall 28a and side walls 28b which are formed by downwardly bending the four side portions of the top wall 28a and whose lower portions are open. Although not shown, various electronic parts are arranged on the upper surface 21a of the circuit board 21, and the cover 28 is mounted to the circuit board 21 so as to cover these electronic parts.

The cover 28 is arranged on the circuit board 21 such that the side walls 28b are positioned on the inner side of the circuit board 21, avoiding the side through portions 21c, which are recesses. Thus, a large extra space S2 exists between the end portions of the circuit board 21 and the side walls 28b of the cover 28 at the periphery of the circuit board 21. The cover 28 is mounted to the circuit board 21 by soldering the side walls 28b to the grounding patterns 23.

The conventional electronic unit, constructed as described above, is surface mounted on the mother printed board (not shown) of, for example, a mobile phone, by soldering, with the wiring terminal electrode portions 26 and the grounding terminal electrode portions being placed on the mother printed board.

In the conventional electronic unit, the side electrode portions 24 and 25 are formed in the side through portions 21c consisting of recesses provided in the side surfaces 21b of the circuit board 21, and the patterns 22 and 23 on the upper and lower surfaces of the circuit board 21 are connected to the terminal electrode portions 26 and 27 by means of the side electrode portions 24 and 25, so that the cover 28 is arranged so as to avoid the side through portions 21c. Thus, a large extra space S2 exists in the periphery of the circuit board 21, between the end portions of the circuit board 21 and the side walls 28b of the cover 28, such that the size of the circuit board 21 is rather large. This means that it is impossible to effectively utilize the entire upper surface 21a of the circuit board 21 as the wiring patterns 22 and thus, this conventional electronic unit is not suitable for use in a mobile phone, which requires both size and weight reductions.

SUMMARY OF THE INVENTION

Accordingly, it is an object of the present invention to provide an electronic unit having both size and weight reductions.

To achieve the above object, there is provided, in a first aspect of the present invention, an electronic unit comprising a circuit board having on its upper surface a wiring pattern and a grounding pattern, an electric part arranged on the circuit board, and a cover mounted to the circuit board so as to cover the electric part. On the lower surface of the circuit board there are provided a wiring terminal electrode portion and a grounding terminal electrode portion. Connection conductors provided in respective through-holes provide connections between the wiring pattern and the wiring terminal electrode portion and between the grounding pattern and the grounding terminal electrode portion.

In a second aspect of the present invention, an electronic unit is provided wherein a recess, extending over at least the side surface and the lower surface of the circuit board, is formed at positions corresponding to the wiring terminal electrode portion and the grounding terminal electrode portion.

In a third aspect of the present invention, an electronic unit is provided wherein a cutout portion is formed by cutting a corner portion of the rectangular circuit board at a position corresponding to the wiring terminal electrode portion or the grounding terminal electrode portion.

DESCRIPTION OF THE PREFERRED EMBODIMENTS

Figure 1:
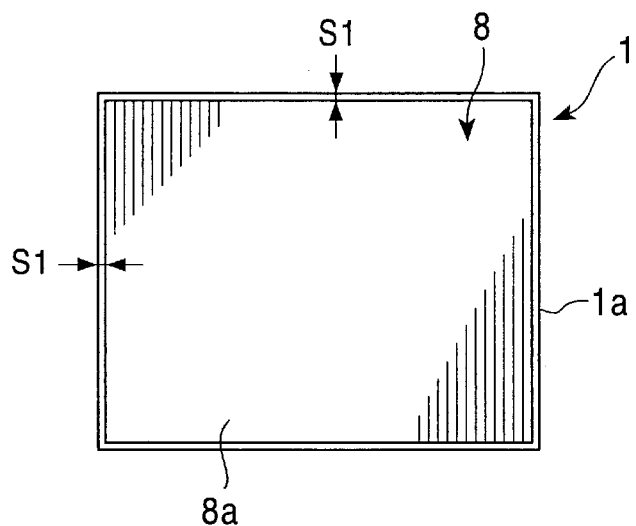
FIG. 1 is a plan view of an electronic unit according to an embodiment of the present invention.
Figure 2:
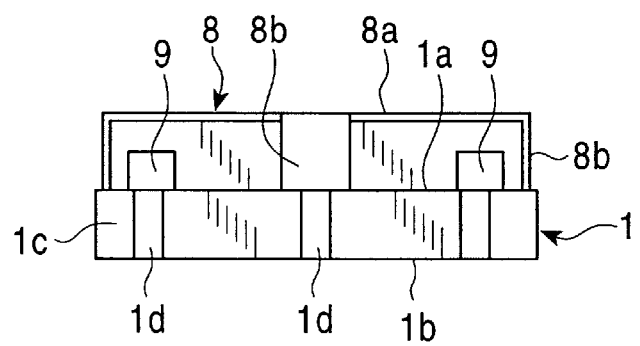
FIG. 2 is a front view of an electronic unit according to an embodiment of the present invention.
Figure 3:
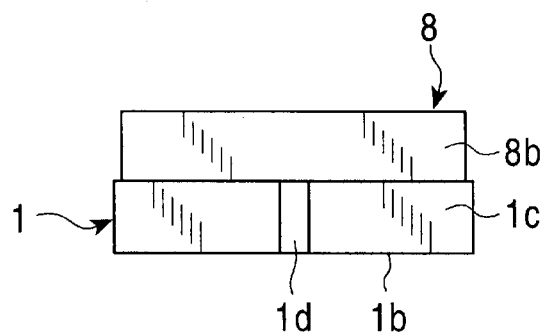
FIG. 3 is a side view of an electronic unit according to an embodiment of the present invention.
Figure 4:
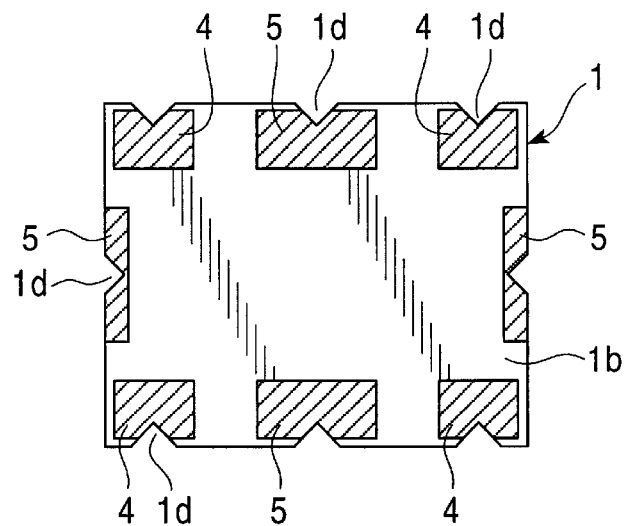
FIG. 4 is a bottom view of an electronic unit according to an embodiment of the present invention.

An electronic unit according to an embodiment of the present invention will be described with reference to the drawings. FIGS. 1 through 5 show an electronic unit according to an embodiment of the present invention. FIG. 1 is a plan view of an electronic unit according to the present invention, FIG. 2 is a front view of an electronic unit according to the present invention, FIG. 3 is a side view of an electronic unit according to the present invention, FIG. 4 is a bottom view of an electronic unit according to the present invention, and FIG. 1 is a sectional view of a main portion of an electronic unit according to the present invention.

Figure 5:
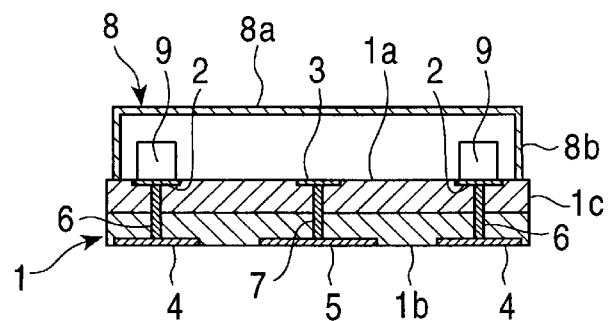
FIG. 5 is a sectional view showing a main portion of an electronic unit according to an embodiment of the present invention.

An electronic unit according to an embodiment of the present invention will be described with reference to FIGS. 1 through 5. A rectangular circuit board 1 is formed by stacking together a plurality of substrates. As shown in FIG. 5, wiring patterns 2 and a grounding pattern 3 are formed on the first or upper surface 1a of the circuit board 1. Although not shown, wiring patterns 2 and grounding patterns 3 are also formed between the layers of the circuit board.

A plurality of wiring terminal electrodes 4 and a plurality of grounding terminal electrodes 5 are provided at predetermined intervals in the periphery of the second or lower surface 1b of the circuit board 1. The wiring terminal electrodes 4 are connected to the wiring patterns 2 by connection conductors 6 provided in through-holes vertically extending through the circuit board 1. The grounding terminal electrodes 5 are similarly connected to the grounding patterns 3 by connection conductors 7 provided in through-holes vertically extending through the circuit board 1. Wedge-shaped recesses 1d extending from the upper surface 1a to the lower surface 1b are formed in the four side surfaces 1c of the circuit board 1 at positions corresponding to the wiring terminal electrodes 4 and the grounding terminal electrodes 5.

A box-shaped cover 8 formed of a metal plate includes a top wall 8a and side walls 8b which are formed by downwardly bending the four edge portions of the top wall 8a and whose lower portions are open. Various electronic parts 9 are arranged on the upper surface 1a of the circuit board 1, and the cover 8 is mounted to the circuit board 1 to cover these electronic parts. The cover 8 may cover the entire outer periphery of the circuit board 1 because the recesses in the side through portions, present in the conventional electronic unit, are absent in the arrangement of the present invention, and thus, there is no need to avoid recesses when arranging the cover 8 on the circuit board 1. A small space S1 exists between the end portions of the circuit board 1 and the side walls 8b of the cover 8 in this embodiment to secure the soldering margin for the cover 8 and the grounding patterns 3. The cover 8 is mounted to the circuit board 1 by soldering the side walls 8b to the grounding patterns 3.

The electronic unit of the present invention, as described above, is surface mounted by soldering, for example, on the mother printed board (not shown) of a mobile phone, with the wiring terminal electrode portions 4 and the grounding terminal electrode portions 5 being placed on cream solder on the mother printed board. When performing this soldering, the recesses 1d provided in the circuit board 1 serve as solder pools, making it possible to visually check the soldering of the electronic unit from an oblique direction.

Figure 6:
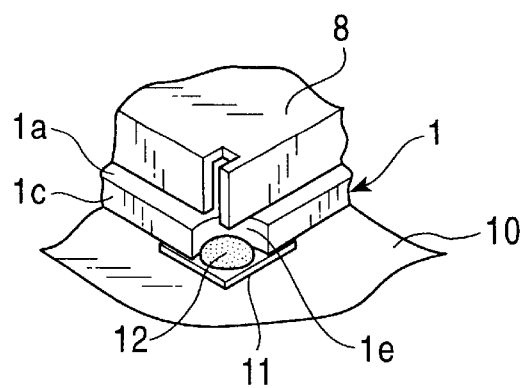
FIG. 6 is a perspective view showing a main portion of an electronic unit according to another embodiment of the present invention.
Figure 7:
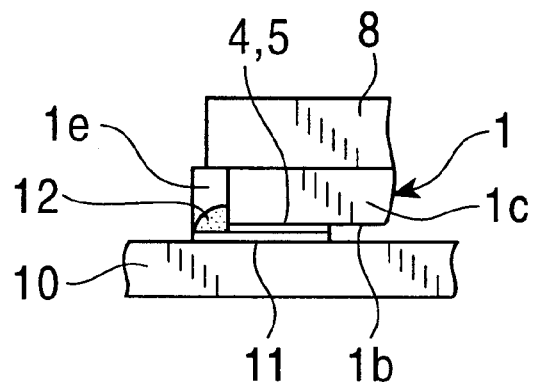
FIG. 7 is a side view showing a main portion of an electronic unit according to another embodiment of the present invention.
Figure 8:
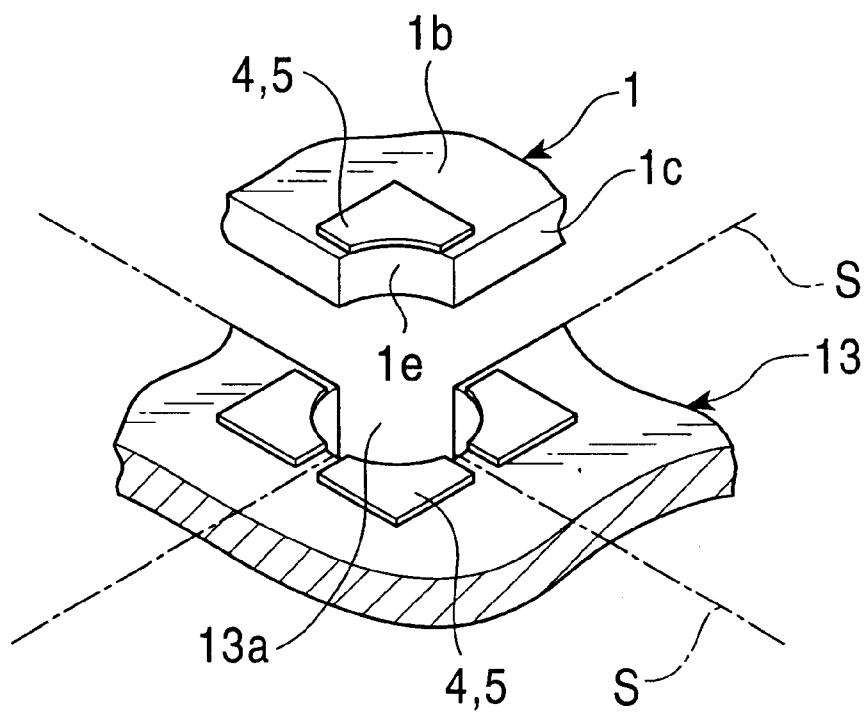
FIG. 8 is a diagram illustrating a method for manufacturing a circuit board in an electronic unit according to another embodiment of the present invention.
Figure 9:
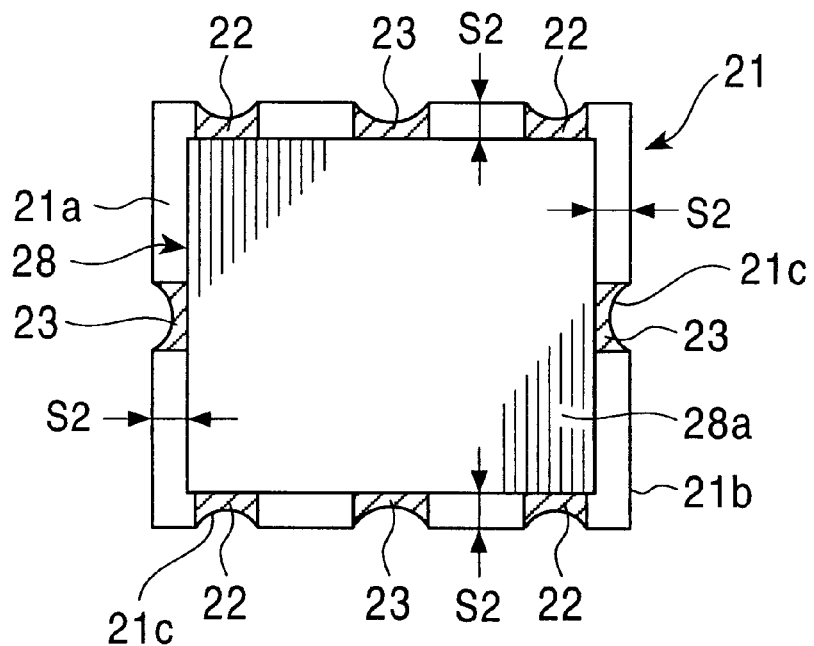
FIG. 9 is a plan view of a conventional electronic unit.
Figure 10:
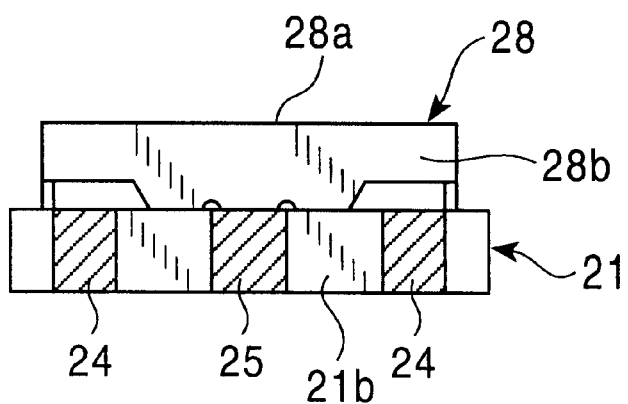
FIG. 10 is a front view of the conventional electronic unit.
Figure 11:
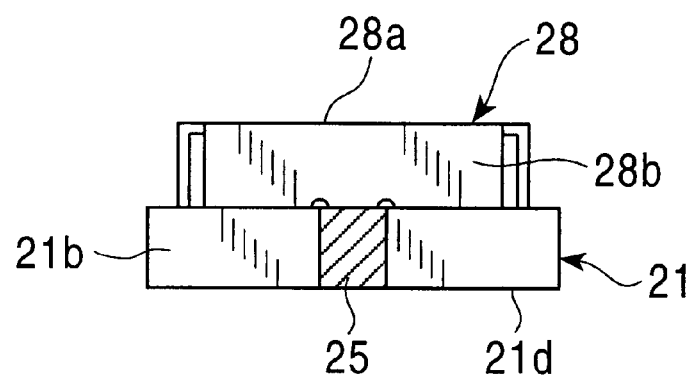
FIG. 11 is a side view of the conventional electronic unit.
Figure 12:
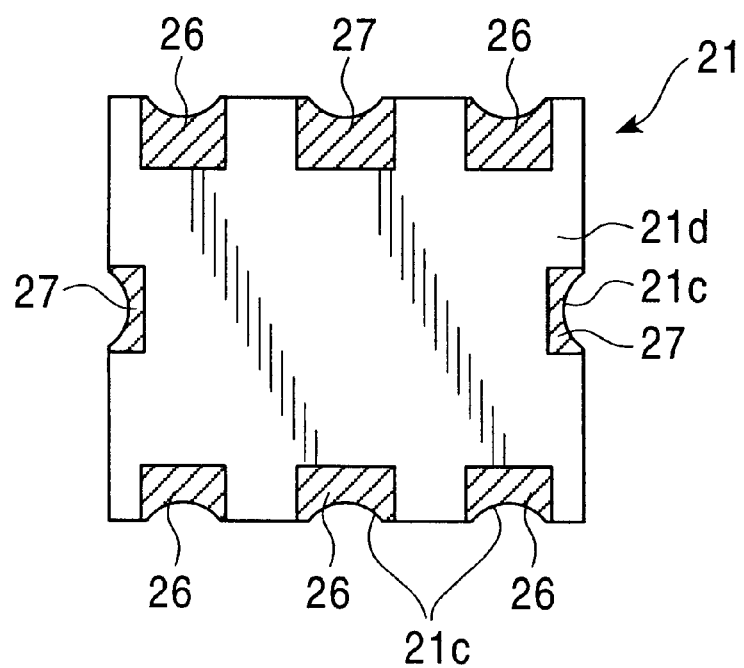
FIG. 12 is a bottom view of the conventional electronic unit.

FIGS. 6 through 8 illustrate an electronic unit according to another embodiment of the present invention. This embodiment is similar to the first embodiment, so the same components are indicated by the same reference numerals and a description of such components will be omitted. In this embodiment, either the wiring terminal electrode portion 4 or the grounding terminal electrode portion 5 is provided in each corner portion of the lower surface 1b of the rectangular circuit board 1. A cutout portion 1e is formed by cutting each corner portion of the rectangular circuit board 1 from the upper surface 1a to the lower surface 1b at the position corresponding to the wiring terminal electrode portion 4 or the grounding terminal electrode portion 5.

As shown in FIGS. 6 and 7, the electronic unit of the present invention, as described above, is surface mounted, for example, on a mother printed board 10 of a mobile phone by means of solder 12, with the wiring terminal electrode portions 4 and the grounding terminal electrode portions 5 being placed on cream solder on conductive patterns 11 of the mother printed board 10. When performing this soldering, the cutout potions 1e provided in the circuit board 1 serve as solder pools, making it possible to visually check the soldering of the electronic unit from an oblique direction.

FIG. 8 shows a method for producing the circuit board 1 of an electronic unit according to another embodiment. In this method, a large substrate 13 on which a plurality of circuit boards 1 are arranged side by side is prepared. A hole 13a is provided at the corner portion where the four circuit boards 1 meet to thereby form cutout portions 1e. Then, cutting is performed along the lines S, whereby individual circuit boards each equipped with a corner cutout portion 1e are produced.

In the electronic unit of the present invention, wiring patterns 2 and grounding patterns 3 provided on the upper surface 1a of a circuit board 1 are connected to wiring terminal electrode portions 4 and grounding terminal electrode portions 5 by connection conductors 6 and 7, respectively, provided in the bottom surface 1b of the circuit board 1. As above, in mounting the cover 8, avoiding the side through portions is not necessary in the present invention, as in the prior art, thereby allowing the cover 8 to cover the entire outer periphery of the upper surface of the circuit board 1. Thus, it is possible to effectively utilize the entire upper surface 1a as the wiring pattern 2 and reduce the size of the electronic unit. In particular, this electronic unit is well suited for use in a mobile phone, which require both size and weight reductions.

In addition, recesses 1d extending at least over the side surface 1c and the lower surface 1b of the circuit board 1 are formed at positions corresponding to the wiring terminal electrode portions 4 and the grounding terminal electrode portions 5. The recesses 1d serve as solder pools when performing soldering, making it possible to visually check the soldering of the electronic unit, thereby facilitating the inspection. Cutout portions 1e are formed by cutting the corner portions of the rectangular circuit board 1 at positions corresponding to the wiring terminal electrode portions 4 and the grounding terminal electrode portions 5. Similar to the recesses, the cutout portions 1e serve as solder pools when performing soldering, making it possible to visually check the soldering of the electronic unit, thereby facilitating the inspection.

What is claimed is:

1. An electronic unit comprising:
   a circuit board having a first surface, a second surface, side surfaces, and an end portion, the first surface including a wiring pattern and a grounding pattern, the second surface provided with a wiring terminal electrode portion and a grounding terminal electrode portion;
   a first connection conductor provided in a first through-hole, the first connection conductor connecting the wiring pattern and the wiring terminal electrode portion;

a second connection conductor provided in a second through-hole, the second connection conductor connecting the grounding pattern and the grounding terminal electrode portion;

an electronic part disposed on the wiring pattern; and a cover soldered to the circuit board via the grounding pattern to cover the electronic part such that a decreased soldering margin is formed between the cover and the end portion of the circuit board and the cover covers substantially the entire first surface of the circuit board.

2. An electronic unit according to claim 1, further comprising recesses formed at positions corresponding to the wiring terminal electrode portion and the grounding terminal electrode portion, the recesses extending over a side surface and the second surface of the circuit board.

3. An electronic unit according to claim 2, wherein the recesses are triangularly wedge-shaped, thereby creating solder pools for the second surface and enabling visual confirmation of soldering of the wiring terminal electrode portion and grounding terminal electrode portion to a mother printed circuit board from an oblique angle.

4. An electronic unit according to claim 1, further comprising a cutout portion formed by cutting a corner portion of the circuit board at a position corresponding to one of the wiring terminal electrode portion and the grounding terminal electrode portion, the circuit board having a rectangular configuration.

5. An electronic unit according to claim 4, wherein the cutout portion has a cross-sectional shape of ¼ of a circle, thereby creating solder pools for the second surface and enabling visual confirmation of soldering of the wiring terminal electrode portion and grounding terminal electrode portion to a mother printed circuit board from an oblique angle.

6. A method of effectively utilizing a surface of circuit board in an electronic unit comprising:

providing a circuit board having a first surface and a second surface, an end portion, and side surfaces unencumbered by side electrode portions;

patterning the first surface with a wiring pattern and a grounding pattern;

providing the second surface with a wiring terminal electrode portion and a grounding terminal electrode portion;

providing a first through-hole connecting the wiring pattern and the wiring terminal electrode portion;

conductively connecting the wiring pattern and the wiring terminal electrode portion using a first connection conductor provided in the first through-hole;

providing a second through-hole connecting the grounding pattern and the grounding terminal electrode portion;

conductively connecting the grounding pattern and the grounding terminal electrode portion using a second connection conductor provided in the second through-hole;

providing an electronic part on the wiring pattern; and soldering a cover on the ground pattern to cover the electronic part and substantially the entire first surface, providing a decreased soldering margin between the cover and the end portion of the circuit board and reducing a size of the electronic unit.

7. The method of claim 6, further comprising forming recesses at positions corresponding to the wiring terminal electrode portion and the grounding terminal electrode portion and extending the recesses over a side surface and the second surface of the circuit board.

8. An electronic unit according to claim 7, further comprising forming the recesses to be triangularly wedge-shaped, thereby creating solder pools for the second surface and enabling visual confirmation of soldering of the wiring terminal electrode portion and grounding terminal electrode portion to a mother printed circuit board from an oblique angle.

9. The method of claim 6, further comprising forming a cutout portion by cutting a corner portion of the rectangular circuit board at a position corresponding to one of the wiring terminal electrode portion and the grounding terminal electrode portion.

10. An electronic unit according to claim 9, further comprising forming the cutout portion to have a cross-sectional shape of ¼ of a circle, thereby creating solder pools for the second surface and enabling visual confirmation of soldering of the wiring terminal electrode portion and grounding terminal electrode portion to a mother printed circuit board from an oblique angle.

* * * * *